(12) United States Patent
Kruglick (10) Patent No.: US 8,318,528 B2
(45) Date of Patent: Nov. 27, 2012

(54) SOLAR ARRAY OF TRANSPARENT NANOANTENNAS

(75) Inventor: Ezekiel Kruglick, Poway, CA (US)

(73) Assignee: Empire Technology Development LLC, Wilmington, DE (US)

( * ) Notice: Subject to any disclaimer, the term of this patent is extended or adjusted under 35 U.S.C. 154(b) by 538 days.

(21) Appl. No.: 12/506,079

(22) Filed: Jul. 20, 2009

(65) Prior Publication Data

US 2011/0011436 A1 Jan. 20, 2011

(51) Int. Cl.
*H01L 21/00* (2006.01)

(52) U.S. Cl. ........... 438/73; 257/E25.007; 257/E27.125; 257/E27.126

(58) Field of Classification Search .................... 438/57, 438/73, 72, 94; 257/E25.007, E25.009, E27.124, 257/E27.125, E27.126
See application file for complete search history.

(56) References Cited

U.S. PATENT DOCUMENTS

2006/0145365 A1* 7/2006 Halls et al. ............ 257/E51.022
2010/0206380 A1* 8/2010 Lindquist et al. ............. 136/261

OTHER PUBLICATIONS

Wel Wu, et al, Midinfrared Metamaterials Fabricated by Nanoimprint Lithography, Applied Physics Letters 90, Feb. 6, 2007.
Nanoantennas: Solar arrays that absorb energy even in the dark, http://www.triplepundit.com/pages/nanoantennas-so.php, accessed Jul. 9, 2009.

* cited by examiner

*Primary Examiner* — Brook Kebede (57) ABSTRACT

Implementations and techniques for solar arrays of transparent nanoantennas are generally disclosed.

20 Claims, 6 Drawing Sheets

SOLAR ARRAY OF TRANSPARENT NANOANTENNAS

BACKGROUND

Nanoantennas may be utilized to convert solar energy into electrical energy. Such nanoantennas may absorb infrared energy. Much of this infrared energy may be produced by the Sun. Additionally, the earth may release infrared energy as radiation after the Sun has set. Such nanoantennas may absorb infrared energy from both light from the Sun as well as from the heat radiated from the earth.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

DETAILED DESCRIPTION

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatus, and systems related to solar arrays of transparent nanoantennas.

Nanoantennas may be utilized to convert solar energy into electrical energy. Such nanoantennas may absorb infrared energy. Much of this infrared energy may be produced by the Sun. Additionally, the earth may release infrared energy as radiation after the Sun has set. Such nanoantennas may absorb infrared energy from both light from the Sun as well as from the heat radiated from the earth and/or other hot objects (e.g. car engines, computers, etc.).

FIGS. 1-5 illustrate example structures for fabricating solar arrays of transparent nanoantennas. FIGS. 1-5 are provided for purposes of illustration and are not intended to depict structures having exact dimensionalities, shapes etc. nor to depict all components or structures that may be present in some implementations but that have been excluded from FIGS. 1-5 to avoid unnecessarily obscuring claimed subject matter.

Figure 1:
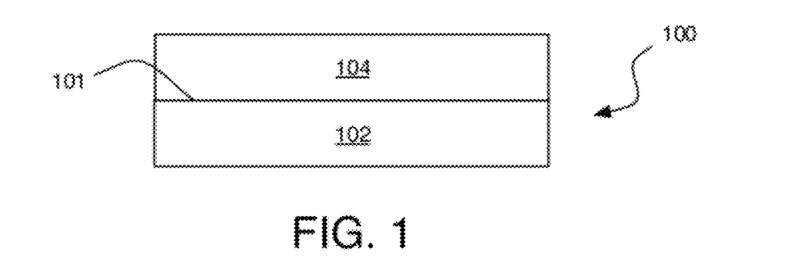
FIG. 1 illustrates a cross-sectional side view of a portion of a solar array at a given stage of processing.

FIG. 1 illustrates a cross-sectional side view of a portion of a solar array 100 at a given stage of processing, in accordance with at least some embodiments of the present disclosure. Solar array 100 may include a substrate 102. Substrate 102 may comprise a transparent material. For example, substrate 100 may include such transparent materials as silica based glass, quartz, non-silica based glass, and/or the like, and/or combinations thereof. Such non-silica based glass may comprise plastics, carbon based glass, metallic glass, and/or the like, for example.

A first transparent conductive layer 104 may be deposited on a surface 101 of substrate 102 so as to be coupled to the surface 101 of the transparent substrate 102. For example, transparent conductive layer 104 may be deposited via electron beam evaporation, physical vapor deposition, sputter deposition techniques, and/or the like depending on the materials being deposited. Transparent conductive layer 104 may comprise a material transparent to visible light. Additionally or alternatively, transparent conductive layer 104 may comprise a material capable of conducting electricity. For example transparent conductive layer 104 may include such transparent and/or conductive materials as one or more transparent conductors, ceramic matrix containing nanotubes, and/or the like, and/or combinations thereof. For example, such a ceramic matrix containing nanotubes may include a nanotube slurry that may be capable of being encased in a polymer binder, glass, and/or the like, and/or combinations thereof.

Such transparent conductors may include indium tin oxide, an/or the like, for example. In some cases, the transparency of transparent conductive layer 104 may depend on the thickness of a given material. For example, transparent conductive layer 104 may be deposited as a thin film. In such a case, transparent conductive layer 104 may be deposited as a thin film with a thickness in a range from about 0.1 microns to about 1.0 micron.

Additionally, in some cases, transparent conductive layer 104 may be transparent to visible light while having poor transmittance in a non-visible portion of the light spectrum. For example, as indium tin oxide may be transparent to visible light while having poor transmittance in the infrared portion of the light spectrum. In operation, transparent conductive layer 104 may be capable of allowing visible light to pass therethrough and may additionally or alternatively be capable of serving as a contact to transport a photogenerated alternating current away from solar array 100.

Figure 2:
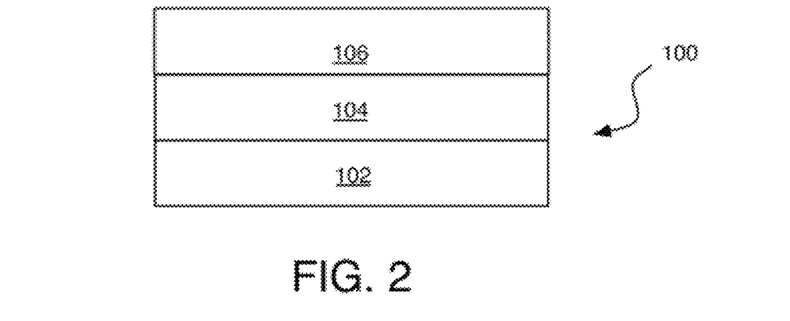
FIG. 2 illustrates a cross-sectional side view of a portion of a solar array at a given stage of processing.

FIG. 2 illustrates a cross-sectional side view of a portion of a solar array 100 at a given stage of processing, in accordance with at least some embodiments of the present disclosure. As illustrated, surface layer 106 may be applied on the transparent conductive layer 104. Surface layer 106 may be a layer of photoresist material. For example, surface layer 106 may be a photoresist layer suitable for patterning using photo-lithography techniques.

Figure 3:
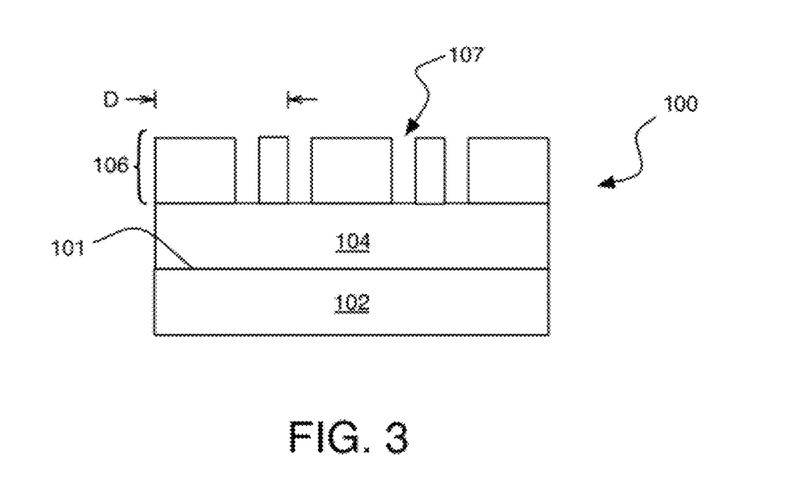
FIG. 3 illustrates a cross-sectional side view of a portion of a solar array at a given stage of processing.

FIG. 3 illustrates a cross-sectional side view of a portion of a solar array 100 at a given stage of processing, in accordance with at least some embodiments of the present disclosure. As illustrated, surface layer 106 may be patterned to form nanometer-sized features 107. For example, surface layer 106 may be lithographically patterned to form nanometer-sized features 107. In some implementations, surface layer 106 may be patterned using Nano-imprint Lithography (NIL) techniques. However, other embodiments are not limited in this regard, and thus, for example, surface layer 106 may be a photoresist layer suitable for patterning using optical lithography techniques (e.g., Extreme Ultraviolet (EUV) lithography), or, for another example, surface layer 106 may be suitable for patterning using electron beam lithography techniques (e.g., Electron Beam Lithography (EBL)). In the structure depicted in FIG. 3 and subsequent figures, features 107 are illustrated corresponding to a cross-sectional view of nanometer-sized features that may extend horizontally over surface 101 of substrate 102 and that expose portions of surface 101. In some implementations, a diameter D of features 107 may range from about 0.05 microns to about 10.00 microns. In one example, such nanometer-sized features 107 may be transparent nanoantennas (see item 108 of FIG. 4 below) In such an example, a diameter D of transparent nanoantennas may range from about 0.5 microns to about 5.0 microns.

Figure 4:
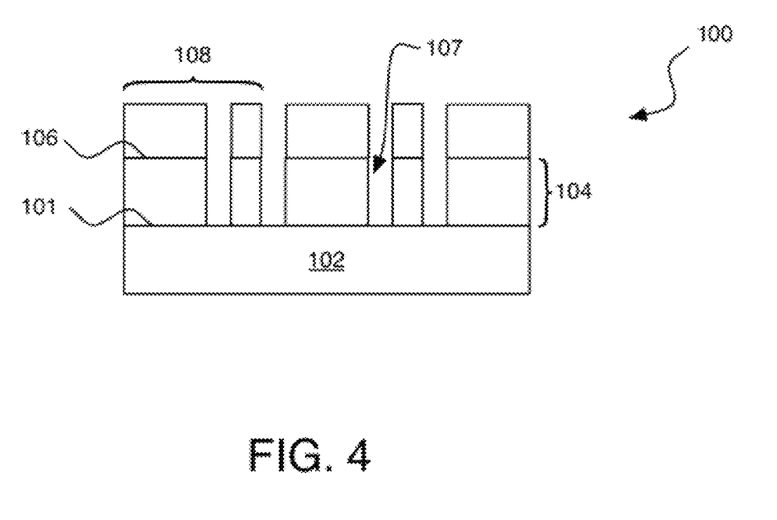
FIG. 4 illustrates a cross-sectional side view of a portion of a solar array at a given stage of processing.

FIG. 4 illustrates a cross-sectional side view of a portion of a solar array 100 at a given stage of processing, in accordance with at least some embodiments of the present disclosure. As illustrated, transparent conductive layer 104 may be etched to form the solar array 100 including form nanometer-sized features 107. Such an etch operation may be a wet etch or a dry etch. In one example, a wet etch may be performed via a mixture of hydrochloric acid, acetic acid, and water with the acids in a range of about 1% to about 10% weight mixture with the water, and/or the like. Such a wet etch may be non-harmful to the substrate 102. In other examples, a dry etch may be utilized, such as reactive ion etch (RIE), plasma enhanced deep reactive ion etch, and/or the like.

In one example, such nanometer-sized features 107 may be transparent nanoantennas. In such an example, a solar array 100 of transparent nanoantennas 108 may be capable of converting infrared energy into an electrical signal. Transparent nanoantennas 108 may be oriented and arranged to convert infrared energy into an electrical signal. In such a case, transparent nanoantennas 108 may be of various shapes including spiral-type nanoantennas, bow-tie-type nanoantennas, square-type nanoantennas, and/or the like, and/or combinations thereof. Variations in the shape and/or sizing of transparent nanoantennas 108 may render transparent nanoantennas 108 more suitable for absorbing infrared energy. Additionally or alternatively, a solar array 100 of transparent nanoantennas 108 may be arranged to permit a visible portion of light to pass therethrough. In operation, a solar array 100 of transparent nanoantennas 108 may be arranged to allow visible light to pass therethrough and may additionally or alternatively be arranged to serve as a contact to transport a photogenerated alternating current away from solar array 100.

Figure 7:
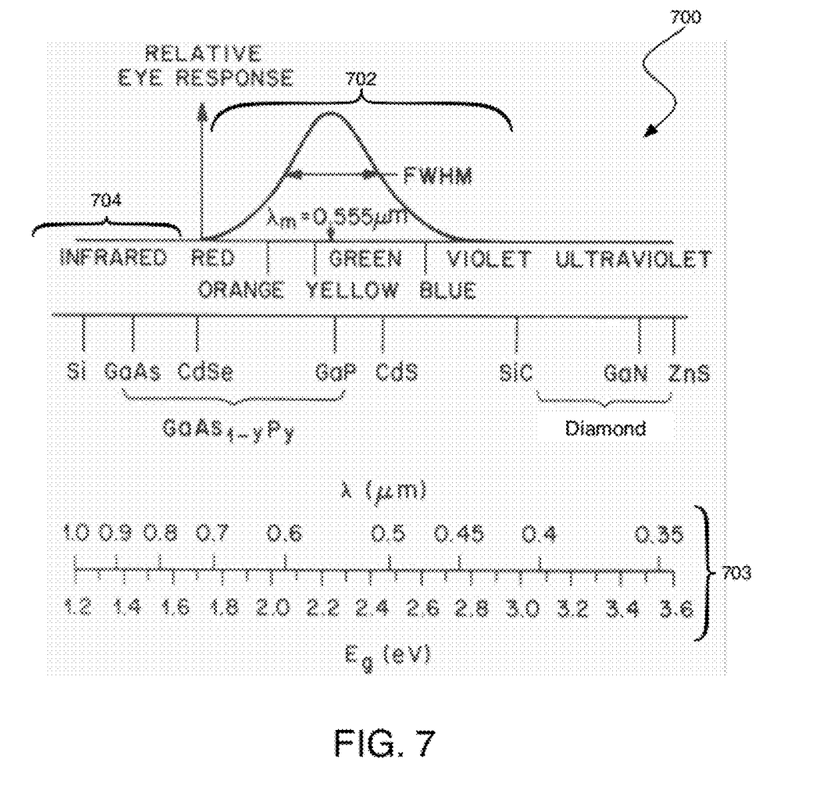
FIG. 7 illustrates a chart of relative eye response to various portions of the light spectrum.

FIG. 7 illustrates a chart 700 of relative eye response to various portions of the light spectrum, in accordance with at least some embodiments of the present disclosure. As illustrated, FIG. 7 illustrates the energy band-gap ($E_g$ in units of eV) for a variety of materials, the visible portion 702 of the light spectrum, and wavelengths 703 of light. The ability of a given material to serve as a photovoltaic device may be dependent on matching the energy band-gap to the energy of the target photon. For example, silicon (Si) may be utilized in the infrared portion 704 of the light spectrum. However, silicon may not present transparent properties in the visible portion 702 of the light spectrum in usable thicknesses.

As described in greater detail above, a solar array 100 of transparent nanoantennas 108 (FIG. 5) may be formulated to be transparent to the visible portion 702 of the light spectrum. Additionally, a solar array 100 of transparent nanoantennas 108 (FIG. 5) may be formulated so as to have an energy band-gap arranged to absorb an infrared portion 704 of the light spectrum. Accordingly, solar array 100 of transparent nanoantennas 108 (FIG. 5) may be arranged to capture energy outside the visible portion 702 of the light spectrum as well as being a transparent inside the visible portion 702 of the light spectrum.

Figure 5:
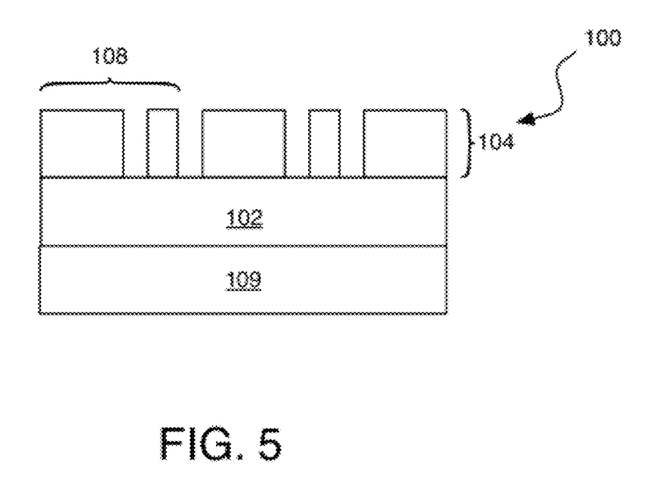
FIG. 5 illustrates a cross-sectional side view of a portion of a solar array at a given stage of processing.

FIG. 5 illustrates a cross-sectional side view a portion of a solar array 100 at a given stage of processing, in accordance with at least some embodiments of the present disclosure. As illustrated, surface layer 106 (FIG. 5) may be removed from solar array 100. For example, excess surface layer 106 may be rinsed from solar array 100, such as via acetone and/or the like.

Additionally or alternatively, one or more antiglare and/or tinting layers 116 may be also added to solar array 100. In one example, as illustrated, one or more antiglare and/or tinting layers 109 may be deposited on transparent substrate 102. Additionally or alternatively, one or more antiglare and/or tinting layers 109 may be deposited on transparent conductive layer 104.

Such antiglare layers may include magnesium fluoride ($MgF_2$), indium tin (e.g. a combination of indium (In) and tin (Sn)), and/or the like, and/or combinations thereof, for example. For example, magnesium fluoride ($MgF_2$) may be utilized as an antiglare layer and may be deposited via physical vapor deposition. Additional or alternative materials may be utilized alone or in combination to form such an antiglare layer. For example, multiple layers may be utilized to broadband antireflection properties. Such broadband antireflection properties may cover visible light and/or other portions of the spectrum, such as ultraviolet, for example.

Such tinting layers may be arranged to restrict certain wavelengths of the light spectrum from passing therethrough. Such tinting layers may include dye, metallization, and/or the like, and/or combinations thereof. In one example, one or more tinting layers may be positioned between a light source and transparent conductive layer 104. In such a case, such tinting layers may be arranged to restrict one or more of an ultraviolet portion, an infrared portion, a visible portion, and/or the like, of the light spectrum from passing therethrough. Additionally or alternatively, one or more tinting layers may be positioned so that transparent conductive layer 104 may be positioned between a light source and the one or more tinting layers. In such a case, such tinting layers may be arranged to restrict an infrared portion, a visible portion, and/or the like, of the light spectrum from passing therethrough.

Figure 6:
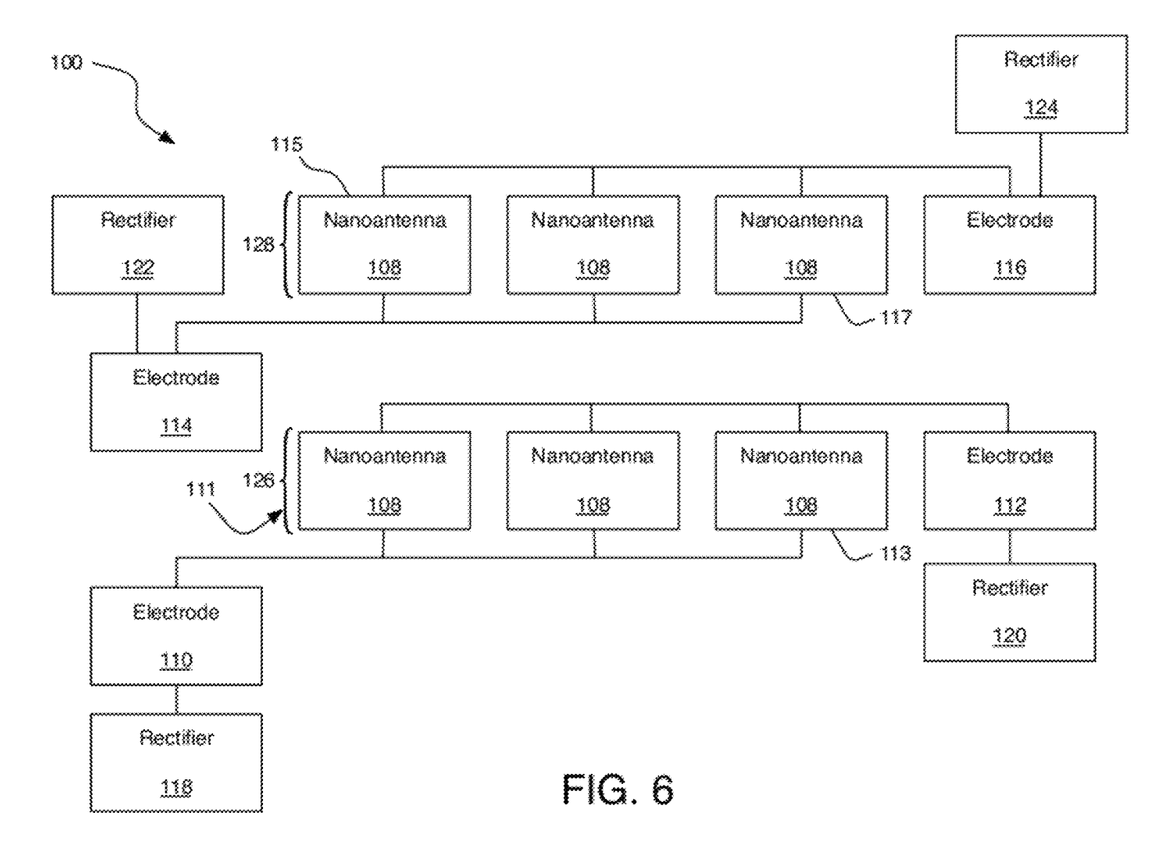
FIG. 6 illustrates a schematic diagram of a portion of a solar array at a given stage of processing.

FIG. 6 illustrates a schematic diagram of a portion of a solar array 100 at a given stage of processing, in accordance with at least some embodiments of the present disclosure. It is noted that FIG. 6 illustrates a solar array 100 with a limited number of rows and columns of transparent nanoantennas 108 for illustration only; accordingly, solar array may include many more rows and columns of transparent nanoantennas 108. As illustrated, a first electrode 110 may be operably connected (e.g., directly coupled or indirectly coupled) to a first end 111 of a row 126 of the solar array 100 of transparent nanoantennas 108. As used herein the term "row" is utilized without limiting to the orientation of solar array 100, and may accordingly be interchangeable with the term "column". Similarly, a second electrode 112 may be operably connected (e.g., directly coupled or indirectly coupled) to a second end 113 of row 126 of the solar array 100 of transparent nanoantennas 108.

Additionally or alternatively, a first rectifier 118 may be operably connected to the first end 111 of row 126 and a second rectifier 120 may be operably connected to the second end 113 of row 126. In the illustrated example, the first rectifier 118 and the second rectifier 120 may be operably connected via the first electrode 110 and the second electrode 112, respectively. In one example, the row 126 and/or the row 128 may include a single transparent nanoantenna 108. In such a case, the first rectifier 118 and the second rectifier 120 may be operably connected to a single transparent nanoantenna 108. Additionally or alternatively, one rectifier, such as either the first rectifier 118 or the second rectifier 120, may be operably connected via both the first electrode 110 and the second electrode 112. The first rectifier 118 and/or the second rectifier 120 may be arranged to rectify the oscillating signal delivered via the transparent nanoantennas 108 into non-oscillating energy.

The same or similar arrangement may be made with respect to additional rows of solar array 100. For example, a first electrode 114 may be operably connected (e.g., directly coupled or indirectly coupled) to a first end 115 of a row 128 of the solar array 100. Similarly, a second electrode 116 may be operably connected (e.g., directly coupled or indirectly coupled) to a second end 117 of row 128 of the solar array 100. Additionally or alternatively, a first rectifier 122 may be operably connected to the first end 115 of the row 128 via the first electrode 114 and a second rectifier 124 may be operably connected to the second end 117 of the row 128 via the second electrode 116.

Electrodes 110, 112, 114 and/or 116 may be designed so as to not be visible to the naked eye. For example, electrodes 110, 112, 114 and/or 116 may be of a limited size. In such a case, electrodes 110, 112, 114 and/or 116 may have a thickness in a range of about 3.0 microns to about 4.0 microns, for example. Electrodes 110, 112, 114 and/or 116 may be formed from gold (Ag), aluminum (Al), chrome (Cr), titanium (Ti), indium tin oxide, copper (Cu), doped semiconductors, and/or other suitable materials. Additionally or alternatively, all or a portion of electrodes 110, 112, 114 and/or 116 may be formed as part of transparent conductive layer 104 during the etch processing illustrated in FIG. 4 above.

Figure 8:
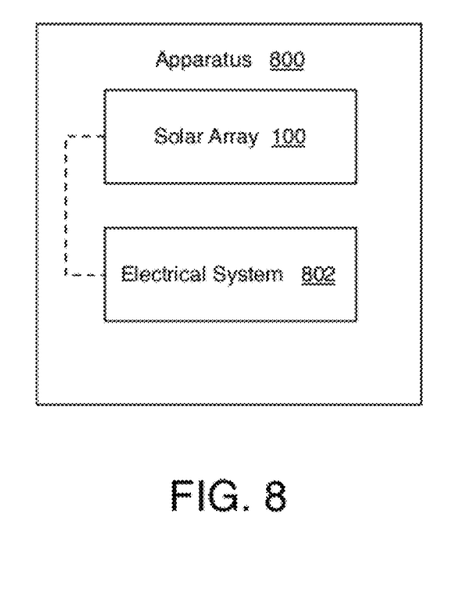
FIG. 8 illustrates an apparatus including a solar array.

FIG. 8 illustrates an apparatus 800 including a solar array 100, in accordance with at least some embodiments of the present disclosure. As illustrated, apparatus 800 may include an electrical system 802 operably connected (e.g., directly coupled or indirectly coupled) to solar array 100. Solar array 100 may be arranged to convert light into one or more electrical signals for use by electrical system 802. In some examples, solar array 100 may be oriented and arranged as a windshield (such as for vehicles, for example), a window (such as for buildings, for example), a lens (such as an eyewear lens, for example), a container (such as a beverage container, for example), and/or the like, and/or combinations thereof. In some examples, apparatus 800 may include at least a portion of a vehicle, a building, eyewear, a container, and/or the like, and/or combinations thereof.

In one example, apparatus 800 may include a vehicle having one or more windshields and/or windows that include solar array 100. In such an example, such a vehicle may also include an electrical system 802 powered at least in part by solar array 100. For example, such a vehicle may include electronics, an electrical motor, lighting, a heating system, a cooling system, and/or the like, and/or combinations thereof (not shown) powered at least in part by solar array 100.

In a further example, apparatus 800 may include a building having one or more windows that include solar array 100. In such an example, such a building may also include an electrical system 802 powered at least in part by solar array 100. For example, such a building may include electronics, lighting, a heating system, a cooling system, and/or the like, and/or combinations thereof (not shown) powered at least in part by solar array 100.

In a still further example, apparatus 800 may include a piece of eyewear having a lens that includes solar array 100. In such an example, such eyewear may also include an electrical system 802 powered at least in part by solar array 100. For example, such eyewear may include a display and/or audio input/output system (not shown) powered at least in part by solar array 100.

In another example, apparatus 800 may include a beverage container having at least a portion thereof that includes solar array 100. In such an example, such a beverage container may also include an electrical system 802 powered at least in part by solar array 100. For example, such a beverage container may include a cooling system (not shown), such as a thermo-electric-type cooling system, powered at least in part by solar array 100.

Figure 9:
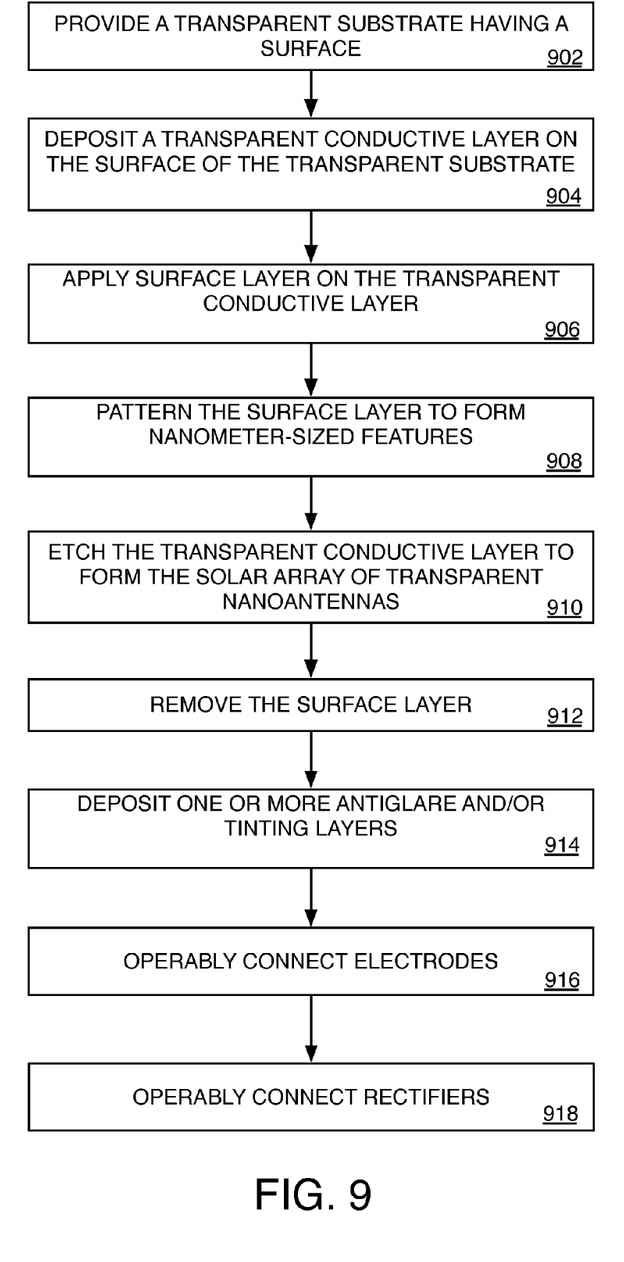
FIG. 9 illustrates an example process for generating solar arrays of transparent nanoantennas; all arranged in accordance with at least some embodiments of the present disclosure.

FIG. 9 illustrates an example process 900 for generating solar arrays of transparent nanoantennas in accordance with at least some embodiments of the present disclosure. Process 900, and other processes described herein, set forth various functional blocks or actions that may be described as processing steps, functional operations, events and/or acts, etc. Those skilled in the art in light of the present disclosure will recognize that numerous alternatives to the functional blocks shown in FIG. 9 may be practiced in various implementations. For example, although process 900, as shown in FIG. 9, comprises one particular order of blocks or actions, the order in which these blocks or actions are presented does not necessarily limit claimed subject matter to any particular order.

Likewise, intervening actions not shown in FIG. 9 and/or additional actions not shown in FIG. 9 may be employed and/or some of the actions shown in FIG. 9 may be eliminated, without departing from the scope of claimed subject matter. An example process 900 may include one or more of blocks 902, 904, 906, 908, 910, 912, 914, 916 and/or 918.

At block 902, a transparent substrate may be provided. At block 904, a transparent conductive layer may be deposited on a surface of substrate. At block 906, a surface layer may be applied on the transparent conductive layer. At block 908, the surface layer may be patterned to form nanometer-sized features. At block 910, the transparent conductive layer may be etched to form the solar array of transparent nanoantennas. As discussed in greater detail above, in some examples, all or portions of such a solar array of transparent nanoantennas may be arranged to convert infrared energy into one or more electrical signals (e.g., voltage, current, charge, etc.) and/or may be arranged to permit a visible portion of light to pass therethrough.

At block 912, the surface layer may be removed. At block 914, one or more antiglare and/or tinting layers may be deposited on the transparent substrate and/or on the transparent conductive layer. Alternatively, all or a portion of such one or more antiglare and/or tinting layers may be deposited earlier or later in process 900. At block 916, a first electrode may be operably connected to a first end of a row of the solar array of transparent nanoantennas and a second electrode may be operably connected to a second end of the row. At block 918, a first rectifier may be operably connected to a first end of a row of the solar array of transparent nanoantennas and a second rectifier may be operably connected to a second end of the row. In one example, such a first rectifier may be operably connected to the first electrode and such a second rectifier may be operably connected to the second electrode. In another example, such a first rectifier may be operably connected to the first electrode and also may be operably connected to the second electrode.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable component. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter also may include all implementations falling within the scope of the appended claims, and equivalents thereof.

What is claimed:

1. A method to produce a solar array of transparent nanoantennas arranged to generate one or more electrical signals in response to light, the method comprising:
providing a transparent substrate having a surface;
depositing a transparent conductive layer on the surface of the transparent substrate;
applying a surface layer on the transparent conductive layer after depositing the transparent conductive layer;
patterning the surface layer to form nanometer-sized features;
etching the transparent conductive layer to form the solar array of transparent nanoantennas after patterning the surface layer; and
removing the surface layer after etching the transparent conductive layer, wherein the resulting solar array of transparent nanoantennas is capable of converting infrared energy from the light into the one or more electrical signals while permitting a visible portion of the light to pass therethrough.

2. The method of claim 1, wherein the surface layer comprises a photoresist layer and wherein patterning the surface layer comprises performing lithography to pattern the photoresist layer.

3. The method of claim 1, wherein patterning the surface layer comprises performing lithography, and wherein performing lithography comprises performing one of nanoimprint lithography, electron beam lithography or extreme ultraviolet photolithography.

4. The method of claim 1, wherein the transparent conductive layer comprises one or more of indium tin oxide and/or a ceramic matrix containing nanotubes.

5. The method of claim 1, wherein the transparent conductive layer has a thickness in a range from about 0.1 microns to about 1.0 microns.

6. The method of claim 1, wherein the transparent nanoantennas comprise one or more of spiral-type nanoantennas, bow-tie-type nanoantennas, square-type nanoantennas, and/or combinations thereof.

7. The method of claim 1, further comprising:
operably connecting a first electrode to a first end of a row of the solar array of transparent nanoantennas; and
operably connecting a second electrode to a second end of the row of the solar array of transparent nanoantennas.

8. The method of claim 1, further comprising:
operably connecting a first rectifier to a first end of a row of the solar array of transparent nanoantennas; and
operably connecting a second rectifier to a second end of the row of the solar array of transparent nanoantennas.

9. The method of claim 1, further comprising:
operably connecting a first electrode to a first end of a row of the solar array of transparent nanoantennas;
operably connecting a second electrode to a second end of the row of the solar array of transparent nanoantennas;
operably connecting a first rectifier to the first electrode; and
operably connecting a second rectifier to the second electrode.

10. The method of claim 1, further comprising:
operably connecting a first electrode to a first end of a row of the solar array of transparent nanoantennas;
operably connecting a second electrode to a second end of the row of the solar array of transparent nanoantennas;
operably connecting a first rectifier to the first electrode; and
operably connecting a second rectifier to the second electrode;
wherein patterning the surface layer comprises performing nanoimprint lithography to pattern a nanoprint photoresist layer, wherein the surface layer comprises the nanoprint photoresist layer;
wherein the transparent conductive layer comprises one or more of indium tin oxide and/or a ceramic matrix containing nanotubes, and wherein the transparent conductive layer has a thickness in a range from about 0.1 microns to about 1.0 microns; and
wherein the transparent nanoantennas comprise one or more of spiral-type nanoantennas, bow-tie-type nanoantennas, square-type nanoantennas, and/or combinations thereof.

11. A method to produce a solar array of transparent nanoantennas arranged to generate one or more electrical signals in response to light, the method comprising:
providing a transparent substrate having a surface;
depositing a transparent conductive layer on the surface of the transparent substrate;
applying a surface layer on the transparent conductive layer;
patterning the surface layer to form nanometer-sized features;
etching the transparent conductive layer to form the solar array of transparent nanoantennas;
removing the patterned surface layer; and
depositing an antiglare layer on the surface of the transparent substrate and the solar array of transparent nanoantennas.

12. The method of claim 11, wherein the antiglare layer comprises one or more of magnesium fluoride, indium tin, and/or combinations thereof.

13. The method of claim 11, wherein depositing the antiglare layer comprises performing a physical vapor deposition.

14. The method of claim 11, wherein the transparent conductive layer comprises one or more of indium tin oxide and/or a ceramic matrix containing nanotubes.

15. The method of claim 11, wherein the transparent nanoantennas comprise one or more of spiral-type nanoantennas, bow-tie-type nanoantennas, square-type nanoantennas, and/or combinations thereof.

16. A method to produce a solar array of transparent nanoantennas arranged to generate one or more electrical signals in response to light, the method comprising:
providing a transparent substrate having a surface;
depositing a indium tin oxide layer having a thickness in the range from about 0.1 microns to 1.0 microns on the surface of the transparent substrate;
applying a surface layer on the indium tin oxide layer;
patterning the surface layer to form nanometer-sized features;
etching the indium tin oxide layer with a mixture of hydrochloric acid, acetic acid, and water to form the solar array of transparent nanoantennas; and
removing the patterned surface layer.

17. The method of claim 16, wherein the transparent nanoantennas comprise one or more of spiral-type nanoantennas, bow-tie-type nanoantennas, square-type nanoantennas, and/or combinations thereof.

18. The method of claim 16, further comprising:

operably connecting a first electrode to a first end of a row of the solar array of transparent nanoantennas;

operably connecting a second electrode to a second end of the row of the solar array of transparent nanoantennas;

operably connecting a first rectifier to the first electrode; and operably connecting a second rectifier to the second electrode.

19. The method of claim 16, further comprising:

depositing an antiglare layer on the surface of the transparent substrate and the solar array of transparent nanoantennas.

20. The method of claim 16, further comprising:

depositing an antiglare layer on a second surface of the transparent substrate, wherein the second surface of the transparent substrate is opposite the surface of the transparent substrate.

* * * * *

UNITED STATES PATENT AND TRADEMARK OFFICE
CERTIFICATE OF CORRECTION

PATENT NO. : 8,318,528 B2  
APPLICATION NO. : 12/506079  
DATED : November 27, 2012  
INVENTOR(S) : Kruglick It is certified that error appears in the above-identified patent and that said Letters Patent is hereby corrected as shown below:

On the Title Page, in Field (56), under "OTHER PUBLICATIONS", in Column 2, Line 1, delete "et al," and insert -- et al., --, therefor.

In Column 3, Line 5, delete "an/or" and insert -- and/or --, therefor.

In Column 3, Line 54, delete "below)" and insert -- below). --, therefor.

Signed and Sealed this  
Fifth Day of February, 2013

Teresa Stanek Rea  
*Acting Director of the United States Patent and Trademark Office*